United States Patent
Fu et al.

(10) Patent No.: US 9,165,760 B2
(45) Date of Patent: Oct. 20, 2015

(54) CLEANING COMPOSITION AND CLEANING METHOD USING THE SAME

(71) Applicant: UWIZ Technology Co., Ltd., Taoyuan County (TW)

(72) Inventors: Yu-Chi Fu, Keelung (TW); Wen-Tsai Tsai, Taipei (TW); Ming-Hui Lu, Taipei (TW); Song-Yuan Chang, Chiayi County (TW)

(73) Assignee: UWIZ Technology Co., Ltd., Taoyuan (TW)

( * ) Notice: Subject to any disclaimer, the term of this patent is extended or adjusted under 35 U.S.C. 154(b) by 167 days.

(21) Appl. No.: 14/054,833

(22) Filed: Oct. 16, 2013

(65) Prior Publication Data

US 2014/0107008 A1 Apr. 17, 2014

(30) Foreign Application Priority Data

Oct. 16, 2012 (TW) .............. 101138102 A

(51) Int. Cl.
| | |
|---|---|
| *H01L 21/02* | (2006.01) |
| *C11D 7/26* | (2006.01) |
| *C11D 7/32* | (2006.01) |
| *C11D 7/50* | (2006.01) |
| *C11D 11/00* | (2006.01) |

(52) U.S. Cl.
CPC .......... *H01L 21/02082* (2013.01); *C11D 7/263* (2013.01); *C11D 7/3209* (2013.01); *C11D 7/3245* (2013.01); *C11D 7/5022* (2013.01); *C11D 11/0047* (2013.01); *H01L 21/02074* (2013.01)

(58) Field of Classification Search
CPC .... C11D 11/0047; C11D 3/30; C11D 7/3218; C11D 7/5022; C11D 3/43
See application file for complete search history.

(56) References Cited

U.S. PATENT DOCUMENTS

| | | | |
|---|---|---|---|
| 5,989,353 A | 11/1999 | Skee et al. | |
| 6,723,691 B2 | 4/2004 | Naghshineh et al. | |
| 6,852,682 B2 | 2/2005 | Small et al. | |
| 6,896,826 B2 | 5/2005 | Wojtczak et al. | |
| 7,435,712 B2 | 10/2008 | Misra et al. | |
| 7,498,295 B2 | 3/2009 | Fisher et al. | |
| 7,605,113 B2 | 10/2009 | Wojtczak et al. | |
| 7,700,532 B2 | 4/2010 | Hayashida et al. | |
| 2007/0232513 A1* | 10/2007 | Hsu | 510/175 |
| 2009/0203566 A1* | 8/2009 | Lee et al. | 510/175 |
| 2010/0065530 A1* | 3/2010 | Walker et al. | 216/13 |
| 2011/0195887 A1* | 8/2011 | Westwood et al. | 510/175 |
| 2013/0061882 A1* | 3/2013 | Wu et al. | 134/26 |
| 2013/0143785 A1* | 6/2013 | Taniguchi et al. | 510/175 |
| 2014/0109931 A1* | 4/2014 | Lee et al. | 134/3 |

FOREIGN PATENT DOCUMENTS

| | | |
|---|---|---|
| TW | I227271 | 2/2005 |
| TW | I337618 | 2/2011 |

* cited by examiner

*Primary Examiner* — Gregory Webb

(74) *Attorney, Agent, or Firm* — Jianq Chyun IP Office

(57) ABSTRACT

A cleaning composition is provided. The cleaning composition includes at least one polyamino-polycarboxylic acid or at least one salt thereof, at least one solvent, at least one substituted or non-substituted phenethylamine and water. The solvent is selected from a group consisting of glycols.

13 Claims, No Drawings

CLEANING COMPOSITION AND CLEANING METHOD USING THE SAME

CROSS-REFERENCE TO RELATED APPLICATION

This application claims the priority benefit of Taiwan application serial no. 101138102, filed on Oct. 16, 2012. The entirety of the above-mentioned patent application is hereby incorporated by reference herein and made a part of this specification.

BACKGROUND

1. Technical Field

The present invention relates to a cleaning composition. Particularly, the present invention relates to a cleaning composition and a cleaning method using such cleaning composition for semiconductor manufacturing processes.

2. Related Art

Among the very-large-scale integration (VLSI) processes, the chemical mechanical polishing (CMP) process can accomplish global planarization of the wafer surface. Particularly, when the semiconductor manufacturing processes progress into sub-micron field, the chemical mechanical polishing technology turns out to be an indispensable technology.

One important item of all the measurement items for measuring the effectiveness of the CMP process is the presence or absence of defects. Defects of the chemical mechanical polishing process include organic residues, small particles, micro-scratches and corrosion. For example, if the contaminants such as residues or smear, which are formed on the polishing pad or wafer after polishing, can not be completely removed during the cleaning step, the performance of the polishing pad will decay, thereby impairing the consistency of the film removal rate and also affecting the electrical performance of elements.

In the prior art, the cleaning solution having, for example, tetramethylammonium hydroxide (TMAH) was used to remove the contaminants on the wafer surface. However, tetramethylammonium hydroxide is toxic and potentially dangerous for manual operation. Accordingly, it is desirable to develop a cleaning fluid that is safe for operation and is capable of removing residual contamination on the wafer surface while maintaining the flatness of the wafer surface.

SUMMARY

The present invention provides a cleaning composition, which has good wetting ability and cleaning efficiency.

The present invention provides a cleaning method for cleaning a wafer, which allows the wafer to have a good surface profile.

The present invention provides a cleaning composition, the cleaning composition comprising at least one polyamino-polycarboxylic acid or at least one salt thereof, at least one solvent, at least one substituted or unsubstituted phenethylamine and water. Among them, the solvent is selected from a group consisting of glycols.

In an embodiment of the present invention, the polyamino-polycarboxylic acid is, for example, a triamine pentaacetic acid.

In one embodiment of the present invention, the triamine pentaacetic acid is, for example, selected from a group consisting of ethylene triamine pentaacetic acid, diethylene triamine pentaacetic acid and triethylene triamine pentaacetic acid.

In an embodiment of the present invention, the salt of the polyamino-polycarboxylic acid is, for example, selected from a group consisting of alkali metal salts, alkaline earth metal salts and ammonium salts.

In an embodiment of the present invention, the content of the polyamino-polycarboxylic acid or the salt thereof relative to the total weight of the cleaning composition is, for example, 0.001 wt % to 10 wt %.

In an embodiment of the present invention, the solvent is, for example, selected from a group consisting of 2-methoxyethanol, 2-ethoxyethanol, 2-propoxyethanol, 2-isopropoxyethanol, 2-butoxyethanol, 2-phenoxyethanol, 2-(2-methoxyethoxy)ethanol, 2-(2-ethoxyethoxy)ethanol, 2-(2-butoxyethoxy)ethanol, 2-isobutoxyethanol, 1,2-propylene glycol, 1,3-propylene glycol, diethylene glycol, triethylene glycol, 1,4-butanediol, 1,5-pentanediol, 1,6-hexanediol, 1,7-heptanediol, 2,3-dimethyl-2,3-butanediol and derivatives thereof.

In one embodiment of the present invention, the content of the solvent relative to the total weight of the cleaning composition is, for example, 0.001 wt % to 10 wt %.

In an embodiment of the present invention, the substituted or unsubstituted phenethylamine includes the compound represented by the Formula (1):

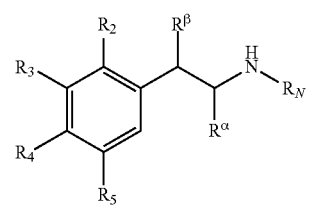

Formula (1)

wherein $R_2$, $R_3$, $R_4$, $R_5$, $R_\alpha$, $R_\beta$ and $R_N$ are each independently hydrogen, a hydroxyl group, an alkyl group or a hydroxyalkyl group.

In an embodiment of the present invention, the content of the substituted or unsubstituted phenethylamine relative to the total weight of the cleaning composition is, for example, 0.001 wt % to 10 wt %.

In one embodiment of the present invention, the content of the water relative to the total weight of the cleaning composition is, for example, 70 wt % to 99.997 wt %.

In one embodiment of the present invention, the pH value of the cleaning composition is 8~12, for example.

The invention proposes a cleaning method comprising using the cleaning composition to clean the wafer.

In an embodiment of the present invention, the cleaning method further comprises cleaning the wafer after performing chemical mechanical polishing to the wafer.

Based on the above, the present invention provides a cleaning composition has good wetting ability and cleaning efficiency. Further, the present invention provides a cleaning method using the proposed cleaning composition to clean the wafer, so that the cleaned wafer has a low surface roughness and a better surface profile.

In order to make the aforementioned and other features and advantages of the disclosure comprehensible, several exemplary embodiments accompanied with figures are described in detail below.

DETAILED DESCRIPTION OF DISCLOSED EMBODIMENTS

The embodiment(s) of the present invention provides a cleaning composition, used for the cleaning process suitable for cleaning the components, such as wafers, the substrate, the polishing pad(s) and the like, after carrying out the semiconductor manufacturing processes, such as, the chemical mechanical polishing process. However, the embodiments provided herein are not intended to limit the scope of application of the present invention.

The cleaning composition comprises at least one polyamino-polycarboxylic acid or at least one salt thereof, at least one solvent, at least one substituted or unsubstituted phenethylamine and water. The various components of cleaning composition will be described in details.

Polyamino-polycarboxylic acids may be, for example, triamine pentaacetic acids. The triamine pentaacetic acid is, for example, selected from a group consisting of ethylene triamine pentaacetic acid, diethylene triamine pentaacetic acid and triethylene triamine pentaacetic acid. The salt of the polyamino-polycarboxylic acid may be selected from a group consisting of alkali metal salts, alkaline earth metal salts and ammonium salts, for example. Relative to the total weight of the cleaning composition, the content of the polyamino-polycarboxylic acid or the salt thereof is, for example, 0.001 wt % to 10 wt %. In one embodiment, relative to the total weight of the cleaning composition, the content of the polyamino-polycarboxylic acid or the salt thereof, is 0.15 wt %, for example.

The above substituted or unsubstituted phenethylamine may be the compound represented by the Formula (1):

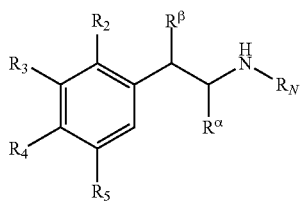

Formula (1)

wherein $R_2$, $R_3$, $R_4$, $R_5$, $R_\alpha$, $R_\beta$ and $R_N$ are each independently hydrogen, a hydroxyl group, an alkyl group or a hydroxyalkyl group. Relative to the total weight of the cleaning composition, the content of the substituted or unsubstituted phenethylamine is, for example, 0.001 wt % to 10 wt %. In one embodiment of the present invention, relative to the total weight of the cleaning composition, the content of the substituted or unsubstituted phenethylamine is, for example, 0.3 wt % to 1.8 wt %.

In addition, the salt of the polyamino-polycarboxylic acid and the above substituted or unsubstituted phenethylamine turn the cleaning composition to be a basic cleaning solution. In one embodiment of the present invention, the pH value of the cleaning composition is 8~12, for example.

The solvent is selected from a group consisting of glycols. In an embodiment of the present invention, the solvent is, for example, selected from a group consisting of 2-methoxyethanol, 2-ethoxyethanol, 2-propoxyethanol, 2-isopropoxyethanol, 2-butoxyethanol, 2-phenoxyethanol, 2-(2-methoxyethoxy)ethanol, 2-(2-ethoxyethoxy)ethanol, 2-(2-butoxyethoxy)ethanol, 2-isobutoxyethanol, 1,2-propylene glycol, 1,3-propylene glycol, diethylene glycol, triethylene glycol, 1,4-butanediol, 1,5-pentanediol, 1,6-hexanediol, 1,7-heptanediol, 2,3-dimethyl-2,3-butanediol and derivatives thereof. Relative to the total weight of the cleaning composition, the content of the solvent is, for example, 0.001 wt % to 10 wt %. In one embodiment of the present invention, relative to the total weight of the cleaning composition, the content of the solvent is, for example, 2 wt % to 5 wt %.

Relative to the total weight of the cleaning composition, the content of the water is, for example, 70 wt % to 99.997 wt %.

Hereinafter, examples and experimental results are described using the proposed cleaning composition of the above embodiments for cleaning the wafer. However, the following experimental examples are not intended to limit the scope of the present invention.

EXAMPLES

The compositions, the weight ratios and pH values of the cleaning compositions denoted as sample 1 to sample 9 are shown in Table 1. Sample 1 and sample 4 are comparative examples. Sample 1 does not contain 2-butoxyethanol, and sample 4 does not contain phenethylamine. In addition, the cleaning compositions of sample 1 to sample 6 include diethylene triamine pentaacetic acid (DTPA), 2-butoxyethanol, phenethylamine and water. Diethylene triamine pentaacetic acid is used as a polyamino-polycarboxylic acid and 2-butoxy ethanol is used as a solvent. Furthermore, sample 7 is prepared using almost the same ingredients of the compositions of sample 1 to sample 6, except for using substituted phenethylamine. On the other hand, sample 8 and sample 9 are prepared using almost the same ingredients of the compositions of sample 1 to sample 6, except for using the salt of the polyamino-polycarboxylic acid.

TABLE 1

| | Ingredients | | | | | | |
|---|---|---|---|---|---|---|---|
| Samples | DTPA wt % | potassium salt of DTPA wt % | ammonium salt of DTPA wt % | 2-butoxy ethanol wt % | phenethyl amine wt % | 3,4-di hydroxy phenethyl amine wt % | pH value |
| Sample 1 | 0.15 | 0.0 | 0.0 | 0.0 | 0.5 | 0.0 | 10 |
| Sample 2 | 0.15 | 0.0 | 0.0 | 2.0 | 0.5 | 0.0 | 10 |
| Sample 3 | 0.15 | 0.0 | 0.0 | 5.0 | 0.5 | 0.0 | 10 |
| Sample 4 | 0.15 | 0.0 | 0.0 | 2.0 | 0.0 | 0.0 | 8.8 |
| Sample 5 | 0.15 | 0.0 | 0.0 | 2.0 | 0.3 | 0.0 | 9 |
| Sample 6 | 0.15 | 0.0 | 0.0 | 2.0 | 1.8 | 0.0 | 12 |
| Sample 7 | 0.15 | 0.0 | 0.0 | 2.0 | 0.0 | 0.6 | 10 |
| Sample 8 | 0.0 | 0.15 | 0.0 | 2.0 | 0.5 | 0.0 | 10 |
| Sample 9 | 0.0 | 0.0 | 0.15 | 2.0 | 0.5 | 0.0 | 10 |

1. Wetting Force Test (Wetting Ability)

Static sessile drop method was used to measure the wetting force of the cleaning compositions of sample 1 to sample 7.

The wafer(s), measuring instruments and test methods are described as follows:

Wafer: 8-inch copper covered wafer(s), having the copper layer with the thickness of 5000 Angstroms, and 8-inch wafer(s) that is covered with low-dielectric constant black diamond II (BDII).

Measuring instruments: Contact angle meter

Experimental methods: The contact angle meter was used to measure the contact angles of the cleaning compositions of sample 1 to sample 7 applied on the copper covered wafer(s) and the BDII wafer(s). The results of the contact angle measurements are shown in Table 2.

TABLE 2

| Sample | contact angles of copper covered wafer (degree) | contact angles of BDII wafer (degree) |
| --- | --- | --- |
| Sample 1 | 57.6 | 59.3 |
| Sample 2 | 41.3 | 51.2 |
| Sample 3 | 42.1 | 52.5 |
| Sample 4 | 52.5 | 55.3 |
| Sample 5 | 43 | 51.4 |
| Sample 6 | 42.3 | 52.3 |
| Sample 7 | 41.5 | 51.1 |
| Sample 8 | 41.4 | 51.1 |
| Sample 9 | 41.2 | 51.3 |

Referring to Table 2, from the contact angle results of the cleaning compositions of sample 1 to sample 3, sample 1 that includes no 2-butoxyethanol has a large contact angle. Compared with sample 1, sample 2 and sample 3 respectively contain 2 wt % and 5 wt % of 2-butoxyethanol, sample 2 and sample 3 have smaller contact angles and thus have better wetting ability. Further, as the content of 2-butoxyethanol in the sample increases, the contact angle becomes smaller. The minimum contact angle is observed when the content of 2-butoxyethanol reaches 2 wt %. However, when the content of 2-butoxyethanol in the sample continues to increase, the contact angle becomes larger. Furthermore, from the results of the contact angle measurements of the cleaning composition of sample 2, sample 4 to sample 6, sample 4 that includes no phenethylamine has a large contact angle. As the content of phenethylamine in the sample increases, the contact angle becomes smaller. The minimum contact angle is observed when the content of phenethylamine reaches 0.5 wt %. However, when the content of phenethylamine in the sample continues to increase, the contact angle becomes larger. In addition, sample 7 that includes substituted phenethylamine (3,4-dihydroxy-phenethylamine) in the cleaning composition also has a very small contact angle, thus also having better wetting ability. Also, sample 8 with the potassium salt of DTPA and sample 9 with the ammonium salt of DTPA have very small contact angles as well as better wetting ability.

Based on the above results, the content of 2-butoxyethanol of 2 wt % is a turning point for the contact angle. Hence, as long as the solvent content is increased to 2 wt %, the wetting ability of the cleaning composition(s) toward the copper film and the BDII film is enhanced. Further, based on the above, the content of phenethylamine of 0.5 wt % is a turning point for the contact angle. As long as the content of phenethylamine is increased to 0.5 wt % phenethylamine, the wetting ability of the cleaning composition(s) toward the copper film and the BDII film is enhanced. Therefore, the cleaning composition(s) using the solvent and substituted or unsubstituted phenethylamine presents better wetting ability toward the wafer, and the wafer can be cleaned effectively. Further, in the case of using the solvent with substituted or unsubstituted phenethylamine collectively, the cleaning composition containing the salt of polyamino-polycarboxylic acid has better wetting ability toward the wafer for effectively cleaning the wafer.

2. Copper Surface Roughness Test

The wafer(s), measuring instruments and test methods are described as follows:

Wafer: 8-inch patterned wafer(s)

Slurry: polishing slurry for the copper fabrication process

Measuring instruments: atomic force microscopy (AFM)

Experimental methods: First, by using the CMP polisher (Mina, product name) with the polishing slurry for the copper fabrication process, the patterned wafer(s) is polished to remove the copper film and the barrier film. Next, using an Ontrak brush box, the post CMP cleaning unit, (Lam Research), jointly with the cleaning compositions of sample 1 to sample 7 as listed in Table 1, at a supply rate of 200 ml/min, the patterned wafer were cleaned twice for 50 seconds. Thereafter, the patterned wafers were spin-dried. Then, by using an atomic force microscope, the average value of the three measured values of the copper surface roughness measured at the positions of 0.18/0.18 μm line width/line space of the patterned wafers are shown in Table 3.

TABLE 3

| Sample | $1^{st}$ scrubbing and cleaning time (sec) | $2^{nd}$ scrubbing and cleaning time (sec) | copper surface roughness (angstrom) |
| --- | --- | --- | --- |
| Sample 1 | 50 | 50 | 6.82 |
| Sample 2 | 50 | 50 | 4.42 |
| Sample 3 | 50 | 50 | 4.58 |
| Sample 4 | 50 | 50 | 5.7 |
| Sample 5 | 50 | 50 | 4.51 |
| Sample 6 | 50 | 50 | 4.47 |
| Sample 7 | 50 | 50 | 4.4 |
| Sample 8 | 50 | 50 | 4.43 |
| Sample 9 | 50 | 50 | 4.41 |

Refer to Table 3, from the results of copper surface roughness measurements by using the cleaning compositions of sample 1 to sample 3, the wafer cleaned by sample 1 with no 2-butoxyethanol has large surface roughness. Compared with sample 1, sample 2 and sample 3 respectively containing 2 wt % and 5 wt % of 2-butoxyethanol, and the wafers cleaned with sample 2 and sample 3 have small surface roughness and better wafer surface profiles. Further, as the content of 2-butoxyethanol in the sample increases, the wafer surface roughness becomes smaller. When the content of 2-butoxyethanol is increased to 2 wt %, the cleaned wafer has the minimum (lowest) surface roughness. Then, when the content of 2-butoxyethanol in the sample continues to increase, the surface roughness of the cleaned wafer becomes larger. In addition, from the results of copper surface roughness measurements by using the cleaning compositions of sample 2 and sample 4 to sample 6, the wafer cleaned with sample 4 with no phenethylamine has large surface roughness. As the content of phenethylamine in the sample increases, the surface roughness of the cleaned wafer is reduced. When the content of phenethylamine is increased to 0.5 wt %, the cleaned wafer has the minimum surface roughness. Then, when the content of phenethylamine in the sample continues to increase, the surface roughness of the cleaned wafer becomes larger. In addition, the wafer cleaned with sample 7 containing 3,4-dihydroxy-phenethylamine likewise presents small surface roughness. On the other hand, the wafers cleaned using sample 8 with the potassium salt of DTPA and sample 9 with the ammonium salt of DTPA also have small surface roughness.

Based on the above, using sample 2 containing 2 wt % 2-butoxy ethanol and 0.5 wt % phenethylamine to wash the wafer can result in the minimum copper surface roughness. Also, the wafer cleaned with sample 7 containing 2 wt % 2-butoxy ethanol and 0.6 wt % 3,4-dihydroxy-phenethylamine presents better copper surface roughness. Therefore, the wafer cleaned by using the cleaning composition(s) using the solvent and substituted or unsubstituted phenethylamine collectively presents better surface profile. Further, in the case of using the solvent with substituted or unsubstituted phenethylamine collectively, using the cleaning composition containing the potassium salt of DTPA or the ammonium salt of DTPA for cleaning the wafer also improves the surface profile of the wafer.

3. Organic Residue Testing

The wafer(s), measuring instruments and test methods are described as follows:

Wafer: Copper wafer

Reagents: 1 wt % benzotriazole (BTA)

Measuring instruments: time-of-flight secondary ion mass spectrometry (ToF-SIMS)

Experimental method: First, a clean copper wafer was immersed in 1 wt % benzotriazole solution for 10 minutes, so that large amounts of Cu-BTA organic species, such $CuC_6H_5N_3$, $CuOC_6H_5N_3$ and $CuC_{12}H_8N_6$ were produced on the copper film over the wafer. Subsequently, time-of-flight secondary ion mass spectrometry is used to measure the concentrations of the organic species on the Cu-BTA organic species enriched surface of the copper. Thereafter, the above-mentioned wafer was cleaned by using the cleaning compositions of sample 1 to sample 7 as listed in Table 1. Then again, time-of-flight secondary ion mass spectrometry is used to measure the treated wafer for measuring the concentrations of the Cu-BTA organic species. The cleaning efficiency is defined as the ratio of the difference between the concentration measured before washing minus the concentration measured after washing divided by the concentration measured before cleaning, the cleaning efficiency for various species of each sample are calculated and the results are shown in Table 4.

TABLE 4

| Sample | Organic residue cleaning efficiency (%) | | | |
|---|---|---|---|---|
| | $C_6H_4N_3$ | $CuC_6H_5N_3$ | $CuOC_6H_5N_3$ | $CuC_{12}H_8N_6$ |
| Sample 1 | 70.1 | 62.5 | 58.6 | 85.4 |
| Sample 2 | 90.5 | 95.4 | 99.5 | 99.1 |
| Sample 3 | 90.1 | 95.0 | 98.0 | 98.8 |
| Sample 4 | 79.1 | 80.5 | 74.2 | 85.6 |
| Sample 5 | 87.9 | 90.2 | 88.7 | 93.4 |
| Sample 6 | 90.3 | 95.0 | 99.0 | 98.9 |
| Sample 7 | 90.4 | 95.7 | 99.7 | 99.0 |
| Sample 8 | 90.4 | 95.4 | 99.5 | 99.2 |
| Sample 9 | 90.5 | 95.5 | 99.4 | 99.1 |

Referring to Table 4, from the results of cleaning efficiency measurements by using the cleaning compositions of sample 1 to sample 3, sample 1 with no 2-butoxyethanol offers low organic residue cleaning efficiency for wafer cleaning. Compared with sample 1, sample 2 and sample 3 respectively containing 2 wt % and 5 wt % of 2-butoxyethanol, and sample 2 and sample 3 have better organic residue cleaning efficiency for the wafers cleaned. Further, as the content of 2-butoxyethanol in the sample increases, the organic residue cleaning efficiency becomes enhanced. When the content of 2-butoxyethanol is increased to 2 wt %, the best organic residue cleaning efficiency is achieved for the cleaned wafer. Then, when the content of 2-butoxyethanol in the sample continues to increase, the organic residue cleaning efficiency toward the cleaned wafer becomes lower. In addition, from the results of using the cleaning compositions of sample 2 and sample 4 to sample 6, the organic residue cleaning efficiency of using sample 4 with no phenethylamine is low. As the content of phenethylamine in the sample increases, the organic residue cleaning efficiency is enhanced. When the content of phenethylamine is increased to 0.5 wt %, the best organic residue cleaning efficiency is achieved for the cleaned wafer. Then, when the content of phenethylamine in the sample continues to increase, the organic residue cleaning efficiency becomes lower. In addition, washing the wafers with sample 7 containing 3,4-dihydroxy-phenethylamine likewise achieves better organic residue cleaning efficiency. On the other hand, better organic residue cleaning efficiency is provided for the wafers washing by sample 8 with the potassium salt of DTPA and sample 9 with the ammonium salt of DTPA.

Based on the above, the best organic residue cleaning efficiency is achieved by cleaning the wafer with sample 2 containing 2 wt % 2-butoxy ethanol and 0.5 wt % phenethylamine. Also, sample 7 containing 2 wt % 2-butoxyethanol and 0.6 wt % 3,4-dihydroxy-phenethylamine also offers better organic residue cleaning efficiency. Therefore, using the cleaning composition having the solvent and substituted or unsubstituted phenethylamine collectively for cleaning wafer can gain the synergic effects in cleaning organic residues. Further, in the case of using the solvent and the substituted or unsubstituted phenethylamine collectively, using the cleaning composition containing the potassium salt of DTPA or the ammonium salt of DTPA for cleaning the wafer also achieve the synergic effects in cleaning organic residues.

In summary, the cleaning compositions and cleaning methods described in the above embodiments can achieve better wetting ability and cleaning efficiency for cleaning the post CMP wafers, so as to effectively remove the organic residues on the wafer(s) and allow the cleaned wafer to have small surface roughness. Further, as the cleaning composition is basic, the wafer can be effectively cleaned without causing damages to metal lines of patterned wafer. In addition, as the cleaning composition does not contain tetramethylammonium hydroxide, the potential operational risks of the cleaning process can be alleviated.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A cleaning composition, the cleaning composition comprising:
   at least one polyamino-polycarboxylic acid or at least one salt thereof;
   at least one solvent, wherein the solvent is selected from a group consisting of glycols; and
   at least one substituted or unsubstituted phenethylamine; and
   water.

2. The cleaning composition as claimed in claim 1, wherein the polyamino-polycarboxylic acid is a triamine pentaacetic acid.

3. The cleaning composition as claimed in claim 2, wherein the triamine pentaacetic acid is selected from a group consisting of ethylene triamine pentaacetic acid, diethylene triamine pentaacetic acid and triethylene triamine pentaacetic acid.

4. The cleaning composition as claimed in claim 1, wherein the salt of the polyamino-polycarboxylic acid is selected from a group consisting of alkali metal salts, alkaline earth metal salts and ammonium salts.

5. The cleaning composition as claimed in claim 1, wherein a content of the polyamino-polycarboxylic acid or the salt thereof is 0.001 wt % to 10 wt %, relative to a total weight of the cleaning composition.

6. The cleaning composition as claimed in claim 1, wherein the solvent is selected from a group consisting of 2-methoxyethanol, 2-ethoxyethanol, 2-propoxyethanol, 2-isopropoxyethanol, 2-butoxyethanol, 2-phenoxyethanol, 2-(2-methoxyethoxyl)ethanol, 2-(2-ethoxyethoxy)ethanol, 2-(2-butoxyethoxy)ethanol, 2-isobutoxyethanol, 1,2-propylene glycol, 1,3-propylene glycol, diethylene glycol, triethylene glycol, 1,4-butanediol, 1,5-pentanediol, 1,6-hexanediol, 1,7-heptanediol, 2,3-dimethyl-2,3-butanediol and derivatives thereof.

7. The cleaning composition as claimed in claim 1, wherein a content of the solvent is 0.001 wt % to 10 wt %, relative to a total weight of the cleaning composition.

8. The cleaning composition as claimed in claim 1, wherein the substituted or unsubstituted phenethylamine includes a compound represented by Formula (1):

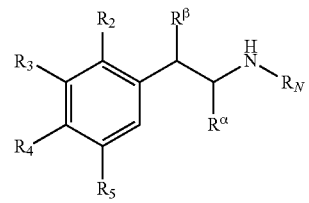

Formula (1)

wherein $R_2$, $R_3$, $R_4$, $R_5$, $R_\alpha$, $R_\beta$ and $R_N$ are each independently hydrogen, a hydroxyl group, an alkyl group or a hydroxyalkyl group.

9. The cleaning composition as claimed in claim 1, wherein a content of the substituted or unsubstituted phenethylamine is 0.001 wt % to 10 wt %, relative to a total weight of the cleaning composition.

10. The cleaning composition as claimed in claim 1, wherein a content of the water is 70 wt % to 99.997 wt %, relative to a total weight of the cleaning composition.

11. The cleaning composition as claimed in claim 1, wherein a pH value of the cleaning composition is 8~12.

12. A cleaning method, comprising:
using the cleaning composition of claim 1 to clean a wafer.

13. The method as claimed in claim 12, further comprises cleaning the wafer after performing chemical mechanical polishing to the wafer.

* * * * *